United States Patent

Lee et al.

Patent Number: 5,930,448
Date of Patent: Jul. 27, 1999

[54] TRACKING CONTROL CIRCUIT AND METHOD IN DIGITAL IMAGE RECORDING AND REPRODUCING DEVICE USING BIT ERROR RATE

[75] Inventors: Woo-Nyun Lee; Hyung-Joo Lee, both of Suwon, Rep. of Korea

[73] Assignee: Samsung Electronics Co. Ltd., Kyungki-do, Rep. of Korea

[21] Appl. No.: 08/841,599

[22] Filed: Apr. 30, 1997

[30] Foreign Application Priority Data

Jun. 27, 1996 [KR] Rep. of Korea ............. 96-24446

[51] Int. Cl.$^6$ .............. H04N 5/91
[52] U.S. Cl. .............. 386/78; 386/79; 386/90; 360/71
[58] Field of Search .............. 386/14, 47, 51, 386/78, 79, 80, 81, 82, 86, 87, 90, 93, 46; 360/71, 72.1, 73.03, 73.01, 77.13, 77.12, 73.05, 77.06; H04N 5/91

[56] References Cited

U.S. PATENT DOCUMENTS

| | | | |
|---|---|---|---|
| 4,792,953 | 12/1988 | Pasdera et al. | 386/47 |
| 5,038,229 | 8/1991 | Mester | 386/47 |
| 5,193,010 | 3/1993 | Juri et al. | 386/47 |
| 5,381,292 | 1/1995 | Richmond | 360/71 |
| 5,490,017 | 2/1996 | Nakamura et al. | 386/79 |
| 5,684,916 | 11/1997 | Hong | 386/78 |
| 5,760,988 | 6/1998 | Abe et al. | 360/73.11 |

*Primary Examiner*—Andrew I. Faile
*Assistant Examiner*—Vincent F. Boccio
*Attorney, Agent, or Firm*—Sughrue, Mion, Zinn, Macpeak & Seas, PLLC

[57] ABSTRACT

A tracking control circuit is disclosed for use in a digital image recording and reproducing device which has a mechanism (22) for controlling the movement of a magnetic medium according to a servo control signal, which has an error correction code decoder (12), and which reproduces data recorded on the recording medium in sync blocks. The tracking control circuit includes a bit error rate detector (14), a control unit (16, 18) and a servo circuit (20). The bit error rate detector (14) calculates the frequency of bit errors in the reproduced data by counting the number of error flags from the error correction code decoder in each sync block to thereby producing bit error rate data. The control unit (16, 18) generates tracking control data corresponding to bit error rate data generated by the bit error rate detector (14) when the bit error rate data from the bit error rate detector exceeds a predetermined limit. The servo circuit (20) provides a servo control signal corresponding to the tracking control data which is supplied from the control unit (16, 18).

9 Claims, 3 Drawing Sheets

TRACKING CONTROL CIRCUIT AND METHOD IN DIGITAL IMAGE RECORDING AND REPRODUCING DEVICE USING BIT ERROR RATE

BACKGROUND OF THE INVENTION

1. Field of the Invention

This invention relates to a tracking control circuit and method for controlling tracking in a digital image recording and reproducing device. Specifically, this invention is a circuit and method for controlling the tracking operation, using a bit error rate which is signified by the number of errors flags set (each flag being set by correcting a detected error) during detection of a sync block. This application for a tracking control circuit and method is based on Korean Patent Application No. 24446/1996 which is incorporated by reference herein for all purposes.

2. Description of the Related Art

Conventional digital image recording and reproducing devices convert analog image signals into digital image signals, and then compress them for recording. The conventional devices also expand the compressed digital image data upon reproduction, and reconstitute the analog signal for output. Such a conventional digital image recording and reproducing device contains a coder and decoder which uses an error correction code (ECC) to prevent a degradation of picture quality during the recording and reproducing processes.

As is well known in this field, the ECC decoder corrects error bits of code data during the reproducing process, using parity bits of a sync block. Occurrence of an error in a sync block is signaled with an error flag. Thus a bit error rate (BER) may be obtained by counting error flags.

FIG. 1 illustrates a configuration of the data-sync blocks of a video sector according to a super density (SD) digital image recording format. As shown in FIG. 1, the size of each sync block is 90 bytes. Each sync block is composed of a sync area (2 bytes), an identification area (3 bytes), a 77 byte data area, and an inner parity area (8 bytes). Each video sector (or data frame) has one hundred thirty eight sequential sync blocks. An outer parity area, where an outer parity is recorded, occupies the remaining data area of the video sector. Data errors in the sync block are corrected by the ECC decoder through inspections involving parity bits in the inner parity area. When a data (or bit) error occurs, an error flag is triggered by the ECC decoder.

To accurately pick up and reproduce information which has been recorded on a medium such as magnetic tape, for example, in the form of the video sector of FIG. 1, it is essential to control the tracking of recorded tracks. The capstan motor should be controlled so that the head can accurately scan tracks containing recorded information. When tracking is not controlled accurately, the sync signals of the sync block (reproduced from the sync area) are not accurately detected during the ECC operation, resulting in frequent errors. Moreover, a burst error can occur.

The following is a description of a conventional tracking control method used in a digital image recording and reproducing device. During recording, an extra bit is added to the 24 bit data block for automatic track finding (ATF). Twenty-five bits of data are recorded on the medium as an interleave non-return-to-zero-inverted recording. The extra bit is added to the 24 bits of data to generate frequencies f0, f1, and f2 which discriminate three kinds of recording tracks from each other. When reproducing data, pilot frequencies f0, f1, and f2 for ATF are detected by an ATF circuit as signals output from a reproducing amplifier. The ATF circuit then controls the tape speed by controlling a servo, using the detected pilot frequencies.

Since the tracking was conventionally controlled through detection of analog pilot frequencies recorded on the tracks, accurate control could not be established. The conventional tracking method has the problem of low recording efficiency because an extra bit for tracking control (to record the distinct pilot frequencies) is added to the 24 bits of data. As a further disadvantage of the conventional ATF system, an ATF circuit for detecting pilot signals of the present, preceding, and succeeding tracks must be independently added to the system, and as a result the circuit of the system is made more complex.

SUMMARY OF THE INVENTION

An objective of the present invention is to provide a tracking control circuit for detecting the bit error rate from an ECC circuit during the playback operation of a digital image recording and reproducing device.

Another objective of the present invention is to provide a tracking control method for automatically controlling the tracking, in a digital recording and reproducing device, using the bit error rate from the ECC circuit during playback of the digital image.

To accomplish the objectives of the present invention, a tracking control circuit, for use in a digital image recording and reproducing device which reproduces data recorded on a magnetic recording medium in units of sync blocks and includes a mechanism for controlling the movement of the magnetic recording medium according to servo control signals and an error correction code decoder, includes: a bit error rate detector for recording error flags generated by said error correction code decoder, and determining bit error rate; a control unit for generating tracking control data corresponding to the determined bit error rate; and a servo circuit for providing the servo control signals to the mechanism for controlling the movement of the magnetic recording medium, said servo control signals corresponding to the tracking control data from said control unit.

The tracking control method, according to the present invention, includes the steps of: comparing a total bit error rate from multiple sync blocks to a predetermined limit; performing a normal tracking control, when the bit error rate detected is less or equal to the predetermined limit; and transmitting tracking data corresponding to the bit error rate as servo control data, when the bit error rate detected exceeds the predetermined limit.

BRIEF DESCRIPTION OF THE DRAWINGS

A more complete appreciation of this invention and its attendant advantages will become apparent as the invention becomes better understood by reference to the following detailed description when considered in conjunction with the accompanying drawings, where like reference symbols indicate the same or similar components.

DETAILED DESCRIPTION OF THE PREFERRED EMBODIMENT

With reference to the attached drawings, a preferred embodiment of the present invention is described below in detail.

Figure 2:
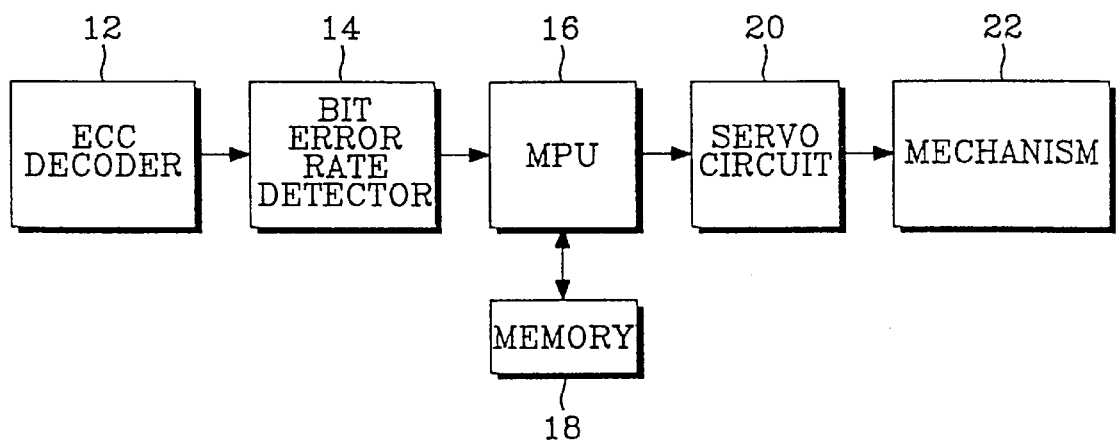
FIG. 2 is a block diagram of a tracking control circuit for a digital image recording and reproducing device according to the present invention.

FIG. 2 is a block diagram of a tracking control circuit which calculates a bit error rate (BER) from error flags triggered by the ECC decoder, and automatically adjusts a servo to control a mechanism which plays the magnetic recording medium. The automatic adjustment of the servo is made according to the calculated BER.

In a normal reproducing process, the signal reproduced from the magnetic recording medium is amplified by a reproducing amplifier (not shown) and then input to ECC decoder 12 of FIG. 2 after passing through a channel coding unit, such as an equalizer, data detector, or a serial to parallel converter (also not shown).

Figure 1:
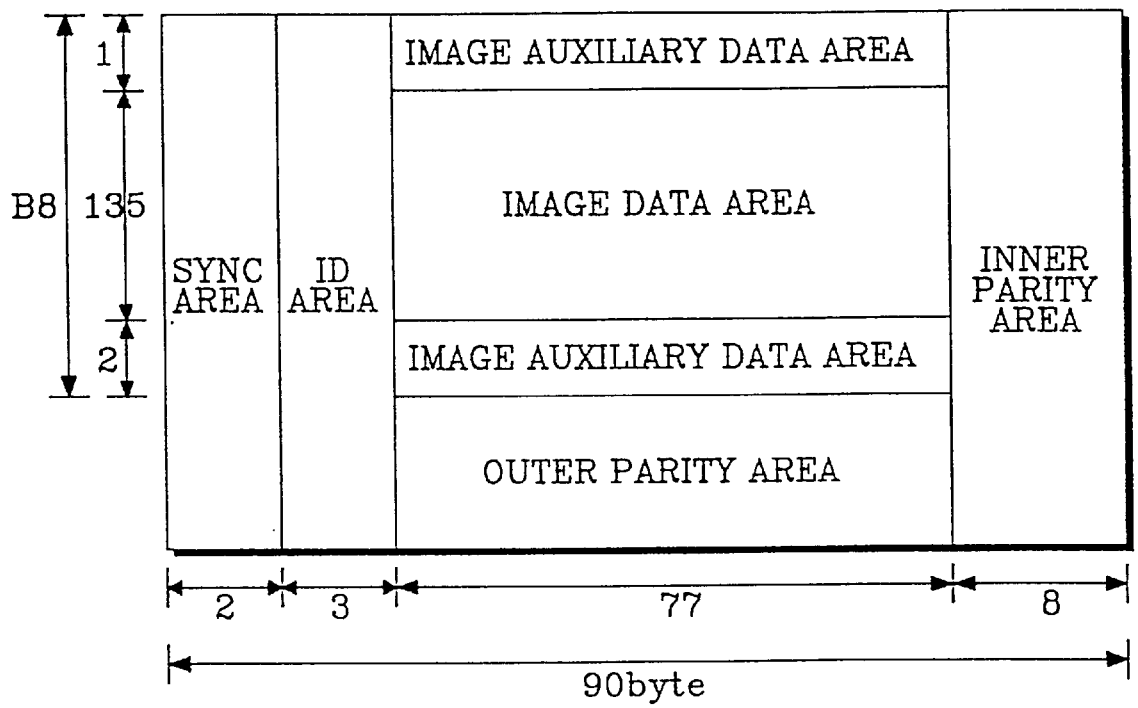
FIG. 1 illustrates the configuration of a data-sync block in a video sector recorded in a super density (SD) digital image recording format.

ECC decoder 12 corrects erroneous data in a sync block of 90 bytes (refer to FIG. 1) using inner parity data in the inner parity area of the sync block. It then generates an error flag indicating detection of the error. The error flag is received by BER detector 14.

BER detector 14 counts the error flags from ECC decoder 12, and calculates a BER for the sync block corresponding to the number of errors which occur in sixty recording tracks.

The details of BER detector 14 mentioned in this invention can be found in Korean Patent Application Number 95-12797 (KPA '797), filed Mar. 3, 1995, for a Device Which Calculates the Bit Error Rate from Sync Block Error Flags. KPA '797 relates to an invention by Hyung-joo Lee, a co-inventor of the invention of the present application. KPA '797 provides a detailed configuration of a device for calculating a BER from error flags generated within a sync block, during an error correction operation. BER detector 14 sends its output to micro-processor (MPU) 16.

Figure 3:
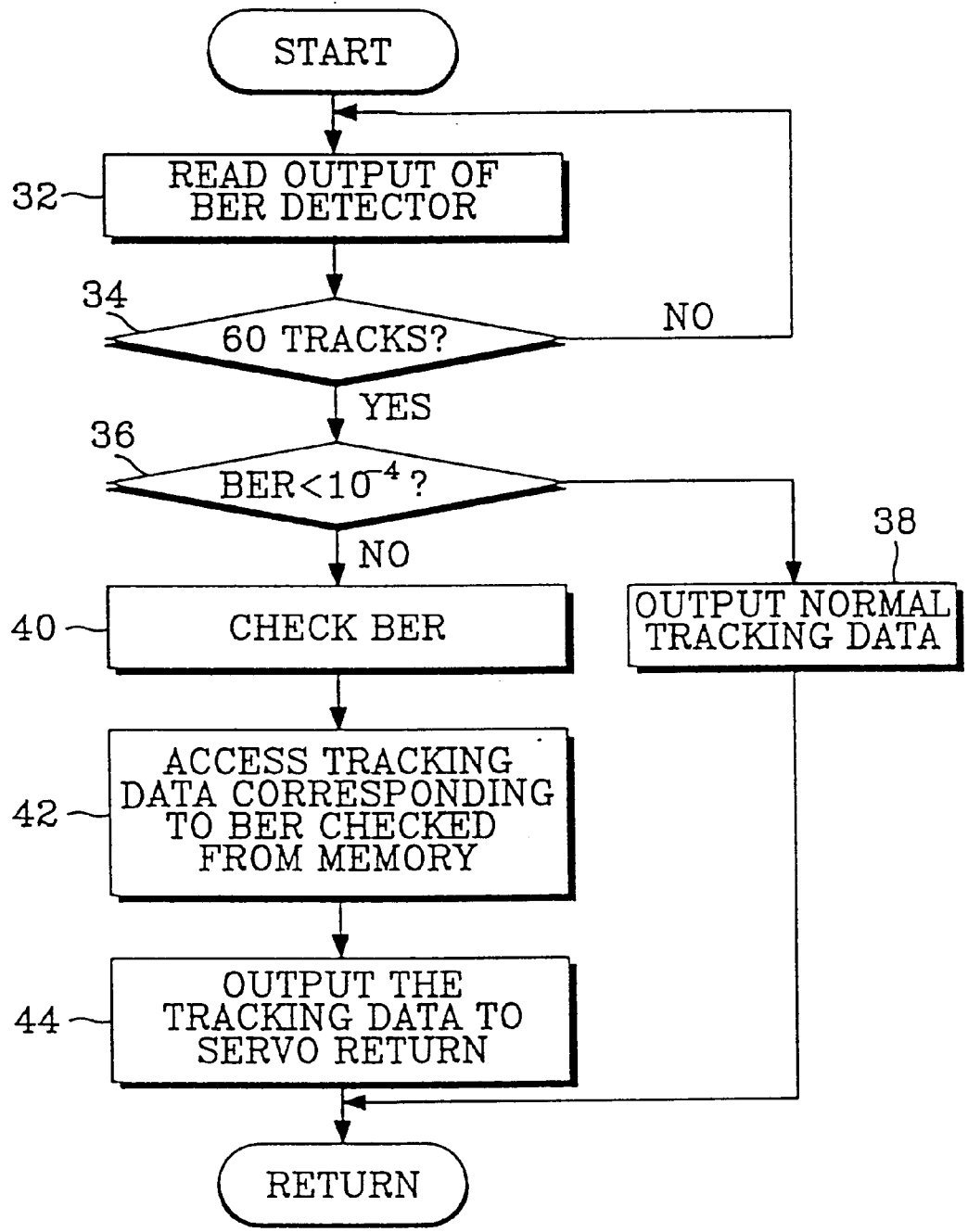
FIG. 3 is a flow chart of a tracking control method using the bit error rate according to the present invention.

MPU 16 performs a tracking control routine as shown in FIG. 3. MPU 16 accesses the output of BER detector 14 at regular intervals (step 32). MPU 16 checks if the value of BER detector 14 corresponds to sixty tracks (step 34). If the value does not correspond to sixty tracks, MPU 16 continuously reads and accumulates the values of BER detector 16 until obtaining a value corresponded to sixty tracks. The sixty tracks are determined from a signal generated every sixty tracks with a track reference signal.

If MPU 16 determines that BER data corresponding to sixty tracks has been achieved, MPU 16 checks whether the BER data corresponding to the sixty tracks is less than a predetermined error limit, for example, $10^{-4}$ (step 36). In other words, MPU 16 checks that the bit error rate is less than one bit error per 10,000 bits, averaged over 60 tracks.

If the BER data is less than the predetermined error limit, MPU 16 determines that the tracking is occurring normally. During normal tracking, MPU 16 accesses the normal tracking data stored in memory 18, and provides it to servo circuit 20 (step 38). Servo circuit 20 then generates a servo control signal corresponding to normal tracking operation to mechanism 22 in order to control the tape running speed.

If the BER data exceeds the predetermined error limit, MPU 16 checks the BER data (step 40). MPU 16 accesses a tracking data, stored in memory 18, which corresponds to the checked BER data (step 42). Memory 18 includes ROM and RAM. The ROM stores program data for the present invention and a table of tracking control data corresponding to the BER data. The RAM temporarily stores data processed by MPU 16.

MPU 16 supplies the accessed tracking control data to servo circuit 20 (step 44). Servo circuit 20 generates a servo control signal corresponding to the tracking control data from MPU 16 to mechanism 22 to control the tape running speed.

As described above, the present invention determines a BER from error flags generated when error correction coded data is reproduced and error-correction-decoded. The present invention then controls tracking of a digital image recording and reproducing device according to the detected BER, thereby simplifying the system.

It should be understood that the present invention is not limited to the particular embodiment disclosed herein as the best mode contemplated for carrying out the present invention, but that various changes may be made to the disclosed embodiment without departing from the spirit and scope of the invention. The present invention is not limited to the specific embodiments described in this specification except as defined in the appended claims.

What is claimed is:

1. A tracking control circuit in a digital image recording and reproducing device which reproduces data recorded on a magnetic recording medium in units of sync blocks and includes a mechanism for controlling the movement of the magnetic recording medium according to servo control signals and an error correction code decoder, the tracking control circuit comprising:

a bit error rate detector for recording error flags generated by said error correction code decoder, and determining bit error rate;

a control unit for generating tracking control data corresponding to the determined bit error rate; and a servo circuit for providing the servo control signals to the mechanism for controlling the movement of the magnetic recording medium, said servo control signals corresponding to the tracking control data from said control unit.

2. The circuit according to claim 1, wherein said bit error rate detector is reset every sixty tracks, and outputs the bit error rate corresponding to sixty tracks.

3. The circuit according to claim 1, wherein said control unit includes:

a memory for storing plural predetermined tracking control data values which each correspond to a predetermined bit error rate value; and a microprocessor for accessing from the memory the tracking control data corresponding to the bit error rate.

4. The circuit according to claim 2, wherein said control unit includes:

a memory for storing plural predetermined tracking control data values which each correspond to a predetermined bit error rate value; and a microprocessor for accessing from the memory the tracking control data corresponding to the bit error rate.

5. A tracking control circuit in a digital image recording and reproducing device which reproduces data recorded on a magnetic recording medium in units of sync blocks and includes a mechanism for controlling the movement of the magnetic recording medium according to servo control signals and an error correction code decoder, the tracking control circuit comprising:

a bit error rate detector for recording error flags generated by said error correction code decoder, and determining bit error rate;

a control unit for generating tracking control data corresponding to the determined bit error rate, when the bit error rate exceeds a predetermined limit; and a servo circuit for providing the servo control signals to the mechanism for controlling the movement of the magnetic recording medium, said servo control signals corresponding to the tracking control data from said control unit.

6. The circuit according to claim 5, wherein said bit error rate detector is reset every sixty tracks, and outputs the bit error rate corresponding to sixty tracks.

7. The circuit according to claim 5, wherein said control unit includes:

a memory for storing plural predetermined tracking control data values which each correspond to a predetermined bit error rate value; and a microprocessor for accessing from the memory the tracking control data corresponding to the bit error rate when the bit error rate exceeds the predetermined limit.

8. The circuit according to claim 6, wherein said control unit includes:

a memory for storing plural predetermined tracking control data values which each correspond to a predetermined bit error rate value; and a microprocessor for accessing from the memory the tracking control data corresponding to the bit error rate when the bit error rate exceeds the predetermined limit.

9. A tracking control method in a digital image recording and reproducing device which has an error correction code decoder for correcting errors in image data reproduced from a recording medium and for triggering an error flag corresponding to an error state within a sync block, a bit error rate detector for counting a number of error flags from said error correction decoder and for calculating a bit error rate, and a servo circuit for controlling a mechanism to control movement of the recording medium according to servo control signals; the method comprising the steps of:

comparing a total bit error rate from multiple sync blocks to a predetermined limit;

performing a normal tracking control, when the bit error rate detected is less or equal to the predetermined limit; and transmitting tracking data corresponding to the bit error rate as servo control data, when the bit error rate detected exceeds the predetermined limit.

* * * * *